United States Patent [19]

Lee

[11] Patent Number: 5,686,344
[45] Date of Patent: Nov. 11, 1997

[54] DEVICE ISOLATION METHOD FOR SEMICONDUCTOR DEVICE

[75] Inventor: Chang-Jae Lee, Cheongju, Rep. of Korea

[73] Assignee: LG Semicon Co., Ltd., Choongchungbook-do, Rep. of Korea

[21] Appl. No.: 582,904

[22] Filed: Jan. 4, 1996

[30] Foreign Application Priority Data

Aug. 12, 1995 [KR] Rep. of Korea ............... 24921/1995

[51] Int. Cl.$^6$ ............................................. H01L 21/76
[52] U.S. Cl. ........................ 437/69; 437/69; 437/56; 148/DIG. 50
[58] Field of Search ..................... 437/67, 72, 63, 437/64, 56, 69; 148/DIG. 50

[56] References Cited

U.S. PATENT DOCUMENTS

| | | |
|---|---|---|
| 4,766,090 | 8/1988 | Coquin et al. |
| 4,994,406 | 2/1991 | Vasquez et al. ............ 437/67 |
| 5,112,772 | 5/1992 | Wilson et al. ............. 437/67 |
| 5,130,268 | 7/1992 | Liou et al. ............... 437/67 |
| 5,455,194 | 10/1995 | Vazquez et al. ........ 148/DIG. 50 |

FOREIGN PATENT DOCUMENTS 0137338  6/1986  Japan ........................ 437/67

OTHER PUBLICATIONS

Percy V Gilbert et al, "Latch-Up Performance of a Sub-0.5 Micron Inter-well Deep Trench Technology" IEDM 93, pp. 731-734.

Primary Examiner—Trung Dang
Attorney, Agent, or Firm—Morgan, Lewis & Bockius LLP

[57] ABSTRACT

An improved device isolation method for a semiconductor device capable of independently and compatibly providing an isolation film in the interior of well and an isolation film between wells during a consistent process, so that latch-up characteristic can be improved even in a device requiring a design rule of below 0.5 µm, which includes a first step which combines a second step which forms a device isolation film within a well and a third step which forms a device isolation film between wells, the second and third steps being compatible to each other during the same step.

19 Claims, 6 Drawing Sheets

DEVICE ISOLATION METHOD FOR SEMICONDUCTOR DEVICE

BACKGROUND OF THE INVENTION

1. Field of the Invention

The present invention relates to a device isolation method for a semiconductor device, and in particular to an improved device isolation method for a semiconductor device capable of independently and compatibly providing an isolation film within a well and an isolation film between wells during a consistent process, so that latch-up characteristic can be prevented even in a device requiring a design rule of below 0.5 µm.

2. Description of the Conventional Art

As shown in FIG. 1, the conventional semiconductor device is directed to forming isolation films within a well and between wells in a device isolation method of a LOCUS between unit devices.

A semiconductor device is directed to restricting latch occurrence by securing enough space between a distance of MOS FET of p-well or n-well in order to decrease current gain of an npn bipolar transistor consisting of n+ junction, p-well and n-well. Here, the n+ junction is source/drain electrodes of an n-channel FET.

However, as the integration level of the semiconductor CMOS device is increased, a design tool of a device having a dimension scale of below 0.5 µm is required in the industry. With the above-mentioned method, it is difficult to prevent latch-up occurrence based on a high integration of device.

Therefore, the deep trench device isolation method has been developed in the industry to substitute the conventional device isolation method within a well or within wells.

One of the above-mentioned deep trench device isolation methods is disclosed in a U.S. Pat. No. 4,766,090 of American telephone and telegraph Co., and Percy V. Gilbert of Motorola Co. disclosed the same in a report "Latch-up performance of a sub-0.5 micron interwell deep trench technology", which is directed to optimizing a deep trench device isolation method between wells in a device of a deep submicron.

The disclosure of the U.S. Pat. No. '090 is directed to forming a trench on a trench and at a boundary between an n-well and a p-well, developing a thermal oxide film at a side wall of the trench, and filling poly silicon or amorphous silicon into the trench. Thereafter, an isolation film formation between a device isolated from the inner wall and another device is achieved in a common device isolation method.

Meanwhile, the report of 93' IEDM of Percy V. Gilbert discloses a method of forming an n-well and a p-well, performing a PBL (poly silicon-buffer LOCUS) device isolation process in a device isolation method within a well, depositing a CVD oxide film, etching with a certain pattern so as to form a trench at a boundary between wells, and forming a trench having a depth 4.0~5.0 µm as shown in FIG. 2A with a mask of a patterned CVD oxide film.

Thereafter, the inside of the trench is cleaned through a silicon moisture etching or using sacrificial oxidation, and a thermal oxide film is developed over the entire surface of the trench. A pattern as shown in FIG. 2B is formed by filling the trench with ozone TEOS. FIG. 2C shows an etch-back process, which is directed to isolating a device within a well by etching back and a device between wells so as to restrict the latch-up.

However, the above-mentioned process is disadvantages in that since it is difficult to overcome the latch-up problems by combining the device isolation process between wells and the device isolation process within a well, each process should be performed independently.

That is, the device isolation process within a well is performed in a common device isolation process and the device isolation process between wells is performed in a deep trench process, so that the above-mentioned two device isolation methods are independently performed, thus increasing fabrication cost and the number of processes. In addition, lengthy turn around time (TAT) is necessary due to the duplicated processes. Moreover, the product fabrication yield decreases.

SUMMARY OF THE INVENTION

Accordingly, it is an object of the present invention to provide a device isolation method for a semiconductor device, which overcome the problems encountered in the conventional device isolation method for a semiconductor device.

It is another object of the present invention to provide an improved device isolation method for a semiconductor device capable of independently and compatibly providing an isolation film within a well and an isolation film between wells during a consistent process, so that latch-up characteristic can be prevented even in a device requiting a design rule of below 0.5 µm.

To achieve the above objects, there is provided a device isolation method for a semiconductor device, which includes a first step which combines a second step which forms a device isolation film within a well and a third step which forms a device isolation film between wells, the second and third steps being compatible to each other during the same step.

To achieve the above objects, in accordance with one embodiment of the present invention there is provided a device isolation method which includes the steps of a first step which forms a trench at a well boundary of a semiconductor substrate having an n-well and a p-well; a second step which forms a thermal oxide film, a silicon film, and a nitride film on the front surface, including a trench, of the substrate in order; a third step which selectively removes the nitride film of a field region; and a fourth step which develops an isolation film in a field region using a thermal oxidation.

To achieve the above objects, in accordance with another embodiment of the present invention there is provided a device isolation method which includes the steps of a first step which forms a trench at a well boundary of a semiconductor substrate having an n-well and a p-well; a second step which forms a thermal oxide film and a nitride film on the front surface, including the trench, of the substrate in order; a third step which selectively removes the nitride film of a field region; a fourth step which develops an isolation film in the field region through a first thermal oxidation; a fifth step which deposits a CVD silicon film and etches back it; and a sixth step which develops an isolation film in the field region through a second thermal oxidation.

To achieve the above objects, in accordance with another embodiment of the present invention there is provided a device isolation method which includes the steps of a first step which forms a trench at a well boundary of a semiconductor having an n-well and a p-well; a second step which forms a thermal oxide film and a nitride film on the front surface, including the trench, of a substrate in order; a third step which selectively removes a nitride film in a field region; a fourth step which develops an isolation film in the field region through a thermal oxidation; and a fifth step which deposits a CVD insulation film and etches back it.

DETAILED DESCRIPTION OF THE INVENTION

The present invention is directed to preventing the latch-up problems, which occurs in a semiconductor CMOS device of a deep sub-micron region, in a deep trench device isolation method between wells, and compatibly performing both the device isolation methods within a well and between wells, so that yield is increased by reducing the number of processes.

Figure 1:
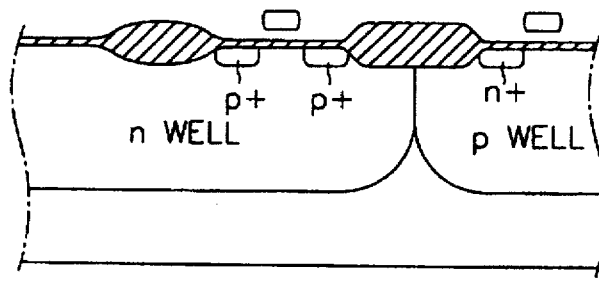
FIG. 1 is a cross-sectional view of well of a conventional semiconductor device and a device isolation construction between wells which is fabricated in a LOCOS method.
Figure 2A:
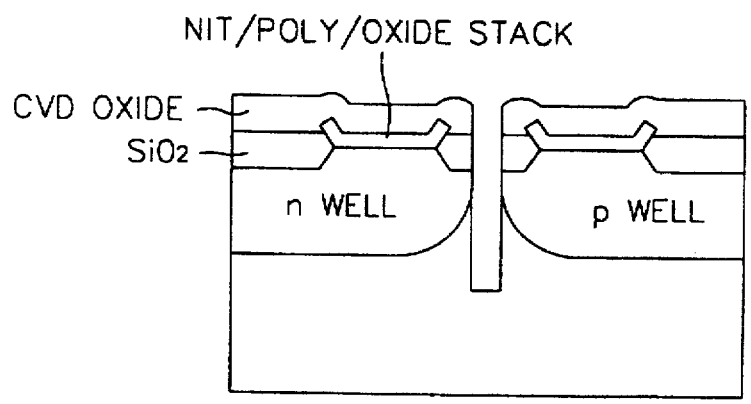
FIGS. 2A through 2C are cross-sectional views showing a device isolation process by a trench between wells of a conventional semiconductor device.
Figure 2B:
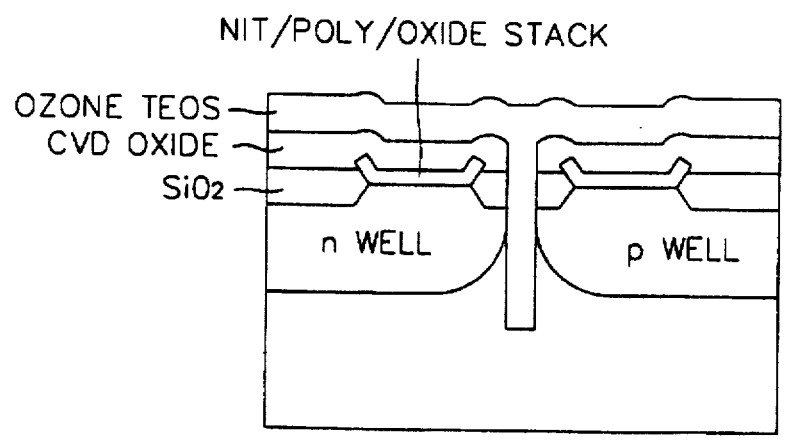
Figure 2C:
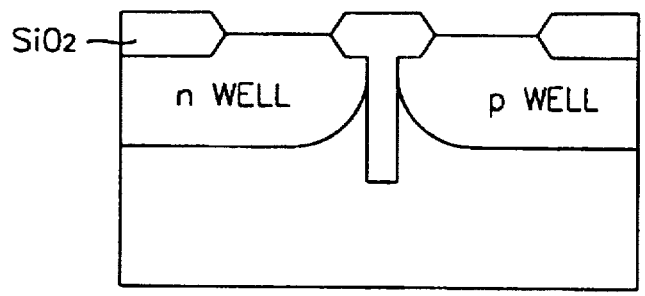
Figure 3A:
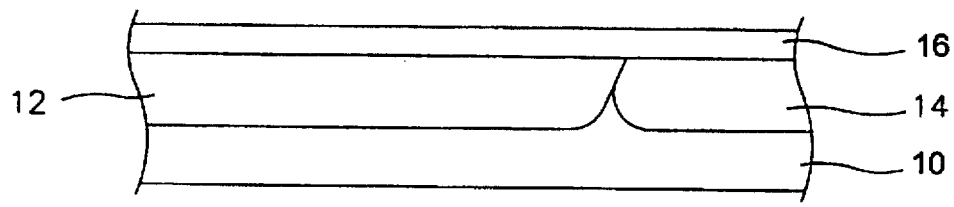
FIGS. 3A through 3G are cross-sectional views showing a device isolation method of a semiconductor device of a first embodiment according to the present invention.

As shown in FIG. 3A, in accordance with a first embodiment of the present invention, an n-well 12 and a p-well 14 are formed in a p-type silicon substrate 10, and a CVD insulation film 16 is formed on the n-well and the p-well to have a thickness of 1000 Å.

Figure 3B:
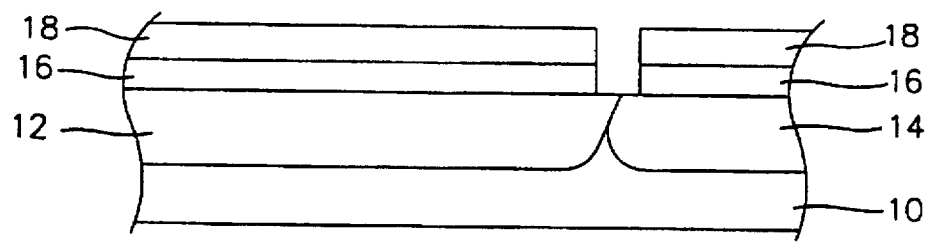

Thereafter, as shown in FIG. 3B, a photosensitive pattern 18 is formed on the CVD insulation film 16 in a photoetching method so as to improve the trench formation at a boundary between the n-well 12 and the p-well 14, and the CVD insulation film 16 exposed by a mask is etched in a reactive ion etching method (RIE) until the substrate is exposed.

Figure 3C:
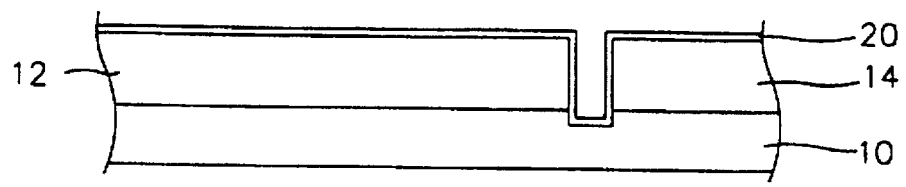
Figure 3D:
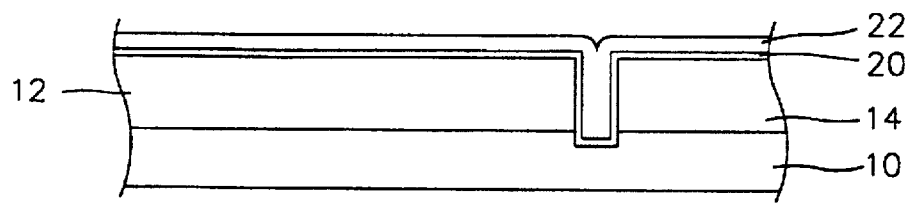

As shown in FIG. 3C, the photosensitive pattern 18 is removed, and a partial region of the substrate of a well boundary region is etched to form a trench having a depth of 4.0–5.0 μm, and $BF_2^+$ of a channel stop ion is filled into the trench at a condition of $5.0 \times 10^{13}$ ions/cm$^2$ and 40 KeV.

At this time, the removal of the photosensitive pattern 18 is directed to overcoming the etching non-uniformity caused due to polymer during a deep trench etching process. Thereafter, the trench is light-etched in the low energy chemical dry etching method using $CF_4/O_2$, and is cleaned in diluted HF liquid so as to remove the CVD oxide film 16.

A thermal oxide film 20 having a thickness of 150 Å is developed on the front surface of the substrate of which the trench is formed in a dry $O_2$ environment at 900° C., and a poly silicon or an amorphous silicon 22 is deposited on the thermal oxide film 20 to have a thickness of 1000 Å in the low pressure chemical vapor deposition (LPCVD) method. Here, the poly silicon 22 is filled into the trench.

Figure 3E:
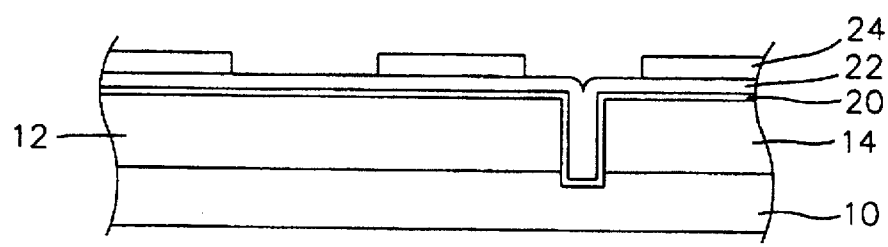

Thereafter, as shown in FIG. 3E, a silicon nitride film 24 is deposited on the poly silicon 22 to have a thickness of 1400 Å, and the region of the same is classified into an active region and a field region in a photo-etching method. As a result, a silicon nitride film remains in the active region on which the device is mounted, and in the field region the silicon nitride film is removed using $CHF_3/CF_4$ so that the surface of the poly silicon 22 of the substrate is exposed.

Thereafter, if necessary, a step of removing the poly silicon 22 of the field region with a mask of the silicon nitride film 24 can be further provided in this embodiment. In this regard, a side wall spacer formed with poly silicon can be formed at the side wall through an etching-back process.

Figure 3F:
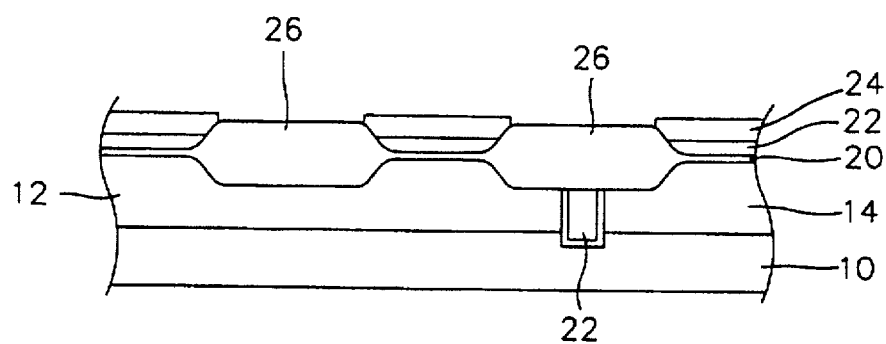
Figure 3G:
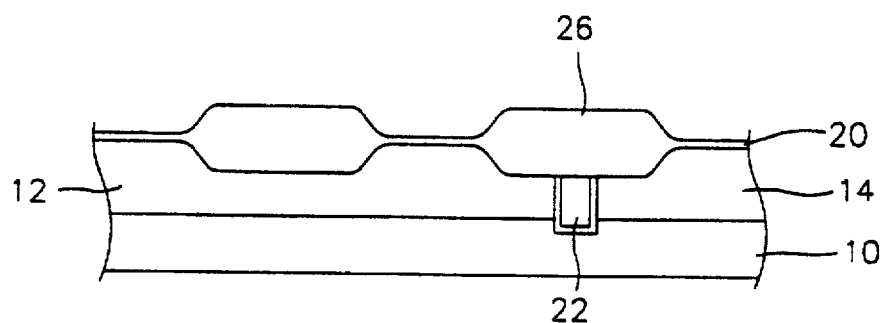

Next, as shown in FIG. 3F, an isolation film 26 having a thickness of 4000 Å is developed at the field region through a thermal oxide process at an environment of $H_2/O_2$. In addition, as shown in FIG. 3G, the silicon nitride film 24 and the poly silicon 22 are removed in order.

Meanwhile, the device isolation method for a semiconductor device of a second embodiment according to the present invention will now be explained with reference to FIGS. 4A through 4K.

Figure 4A:
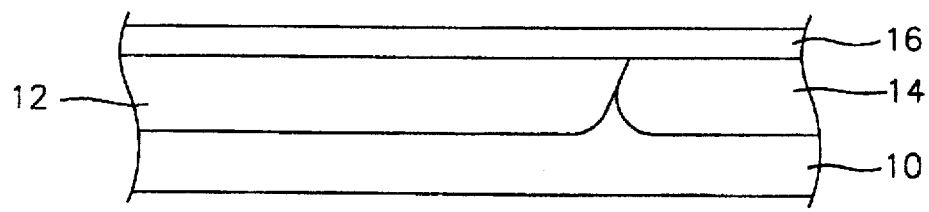
FIGS. 4A through 4J are cross-sectional views showing a device isolation method of a semiconductor device of a second embodiment according to the present invention.
Figure 4B:
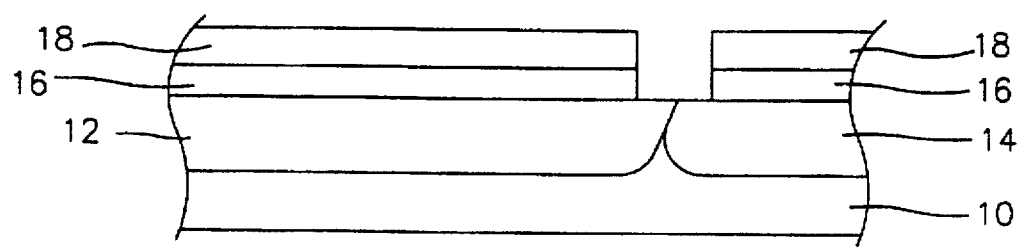
Figure 4C:
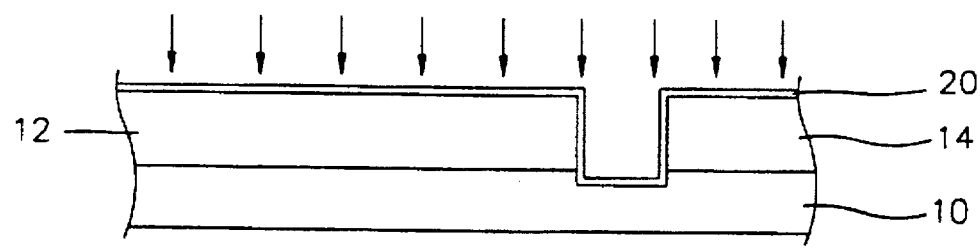
Figure 4D:
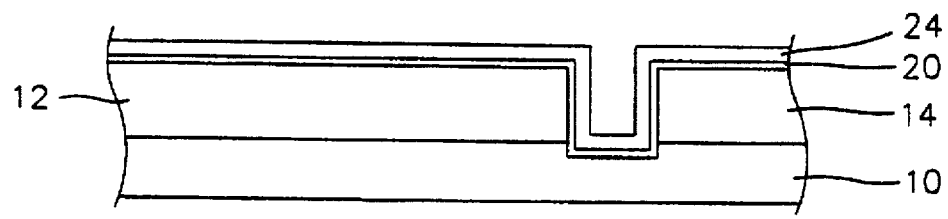

To begin with, since the processes of FIG. 4A through 4C are the same as the first embodiment of the present invention, only the processes of FIGS. 4D through 4K will now be explained.

Figure 4E:
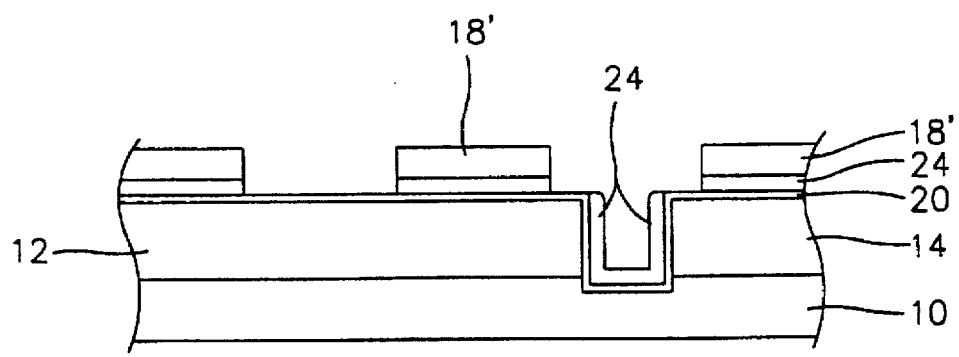

A silicon nitride for 24 is deposited on the thermal oxide film 20 developed on the front surface of the substrate having the trench to have a thickness of 100 Å in the LPCVD method, and a photosensitive film pattern 18' is formed on the silicon nitride 24 in the photo etching method so as to distinguish the active region and the field region, and the silicon nitride film of the field region is removed with a mask of the photosensitive pattern 18' as shown in FIG. 4E.

Figure 4F:
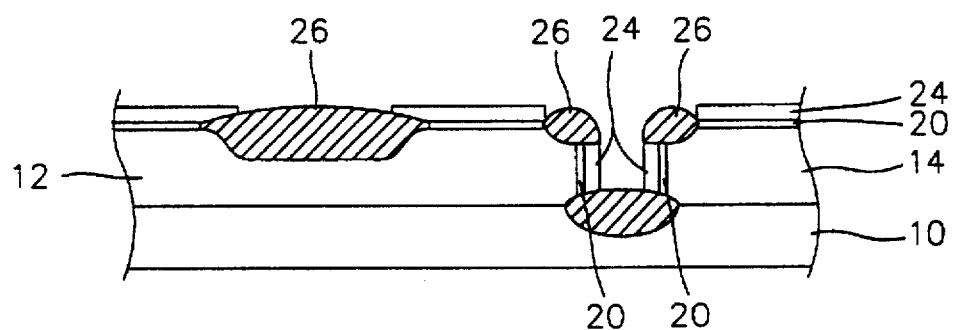

Thereafter, the photosensitive pattern 18' is removed, and an isolation film 26 is developed through a first thermal oxidation process to have a thickness of 2500 Å as shown in FIG. 4F at an environment of 1000° C. and $H_2/O_2$. At this time, if necessary, the ion insertion method can be performed using the isolation film formed after the first thermal oxidation process.

Figure 4G:
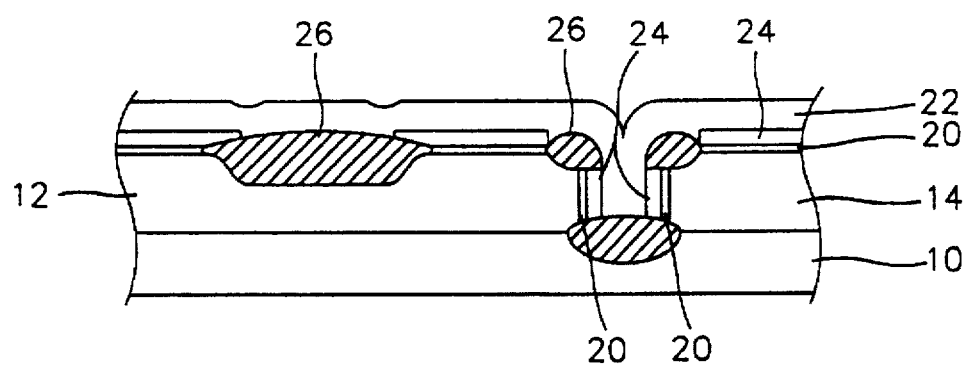
Figure 4H:
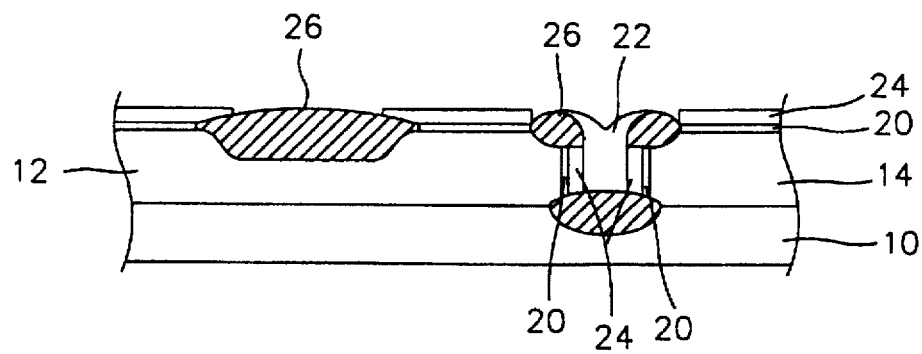
Figure 4I:
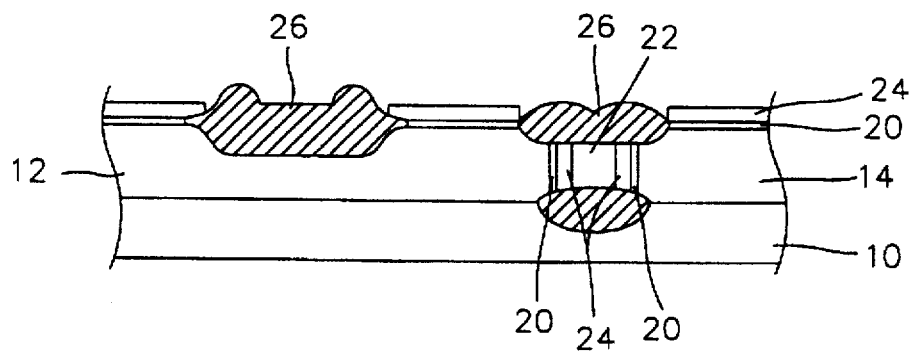

Next, as shown in FIG. 4G, the poly silicon 22 is deposited on the pattern in the LPCVD method, and the poly silicon 22 is etched back in the RIE method, so that a pattern, as shown in FIG. 4I is formed.

Figure 4J:
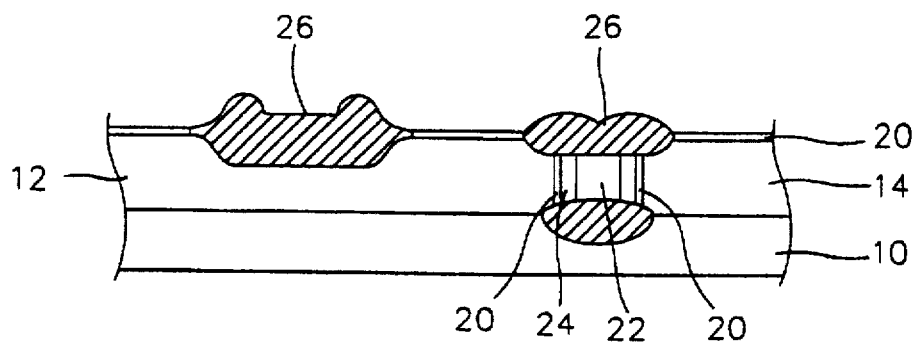

In addition, as shown in FIG. 4J, the isolation fill 26 is developed to have a thickness of 4000 Å at an environment of 1000° C. and $H_2/O_2$ through the second thermal oxidation process, and as shown in 4K, the silicon nitride film 24 is removed by inserting into $H_3PO_4$.

Meanwhile, beside the above-mentioned method, as shown in FIG. 4F, the isolation film having a thickness of 4000 Å can be developed during the first thermal oxidation process. In addition, the CVD insulation film $SiO_2$ is filled into the trench and etched back.

As described above, the device isolation method for a semiconductor device has the following advantages:

1) it is possible to prevent latch-up occurrence between wells by achieving interwell device isolation in the deep trench method so that it is adaptable to a high-integrated density device which requires a design role of below 0.5 μm, and 2) it is possible to compatibly achieve device isolation within a well and between wells through the same process, so that fabrication cost and time of the product can be advantageously reduced by reducing the number of processes, and 3) the yield of the product can be increased.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A device isolation method for a semiconductor device, comprising the steps of:
   a first step which forms a trench at a well boundary of a semiconductor substrate having an n-well and a p-well;
   a second step which forms a thermal oxide film, a silicon film, and a nitride film on the from surface, including the trench, of said substrate in order;
   a third step which selectively removes said nitride film of a field region; and
   a fourth step which develops an isolation film in the field region using a thermal oxidation.

2. The method of claim 1, wherein said silicon film is formed with either a polycrystal silicon or an amorphous silicon.

3. The method of claim 1, wherein said device isolation method of a semiconductor device further includes an ion insertion step which is directed to performing a channel stop ion doping with respect to the bottom of the trench.

4. The method of claim 1, wherein said device isolation method of a semiconductor device further includes a step which removes the silicon film of the field region with a mask of the nitride film.

5. The method of claim 4, wherein during said silicon removing step, a side wall spacer forming of the silicon film is formed at a side wall of the thermal oxide film by an etching back.

6. A device isolation method for a semiconductor device, comprising the steps of:
   a first step which forms a trench at a well boundary of a semiconductor substrate having an n-well and a p-well;
   a second step which forms a thermal oxide film and a nitride film on the front surface, including said trench, of said substrate in order;
   a third step which selectively removes said nitride film of a field region;
   a fourth step which develops an isolation film in said field region through a first thermal oxidation;
   a fifth step which deposits a CVD silicon film and etches back it; and
   a sixth step which develops an isolation film in the field region through a second thermal oxidation.

7. The method of claim 6, wherein said silicon film is formed with either a polycrystal silicon or an amorphous silicon.

8. The method of claim 6, wherein said device isolation method of a semiconductor device further includes an ion insertion step which is directed to performing a channel stop ion doping with respect to the bottom of the trench after either the step of trench formation of the step of first thermal oxidation.

9. The method of claim 8, wherein said third step is directed to substantially removing the nitride film at the bottom of the trench.

10. A device isolation method for a semiconductor device, comprising the steps of:
   a first step which forms a trench at a well boundary of a semiconductor substrate having an n-well and a p-well;
   a second step which forms a thermal oxide film and a nitride film on the front surface, including the trench, of the substrate in order;
   a third step which selectively removes the nitride film in a field region;
   a fourth step which develops an isolation film in said field region through a thermal oxidation; and
   a fifth step which deposits a CVD insulation film and etches back it.

11. The method of claim 10, wherein said device isolation method of a semiconductor device further includes an ion insertion step which is directed to performing a channel stop ion doping with respect to the bottom of the trench.

12. The method of claim 10, wherein said third step is directed to substantially removing the nitride film of the bottom of the trench.

13. The method of claim 1, wherein the trench is formed to a depth of 4.0–5.0 μm.

14. The method of claim 1, wherein the thermal oxide film is formed in a dry $O_2$ environment at about 900° C., and to a thickness of about 150 Å.

15. The method of claim 1, wherein the silicon film is formed with a low pressure chemical vapor deposition and to a thickness of about 1000 Å.

16. The method of claim 1, wherein the step of selectively removing the nitride film is performed by using $CF_3/CF_4$.

17. The method of claim 1, wherein the isolation film is formed to have a thickness of about 4000 Å through a thermal oxide process at an environment of $H_2/O_2$.

18. The method of claim 3, wherein the ion insertion step is performed at a condition of about $5.0 \times 10^{13}$ ions/cm$^2$ and about 40 KeV.

19. The method claim 6, wherein the step of the second thermal oxidation is performed at an environment of about 1000° C. and $H_2/O_2$, and the isolation film is formed to have a thickness of about 4000 Å.

* * * * *

UNITED STATES PATENT AND TRADEMARK OFFICE
CERTIFICATE OF CORRECTION

PATENT NO. : 5,686,344
DATED : November 11, 1997
INVENTOR(S) : Chang-Jae LEE

It is certified that error appears in the above-indentified patent and that said Letters Patent is hereby corrected as shown below:

Col. 5, line 7, change "from" to --front--.

Col. 6, line 4, change "8" to --6--.

Signed and Sealed this

Twenty-second Day of September, 1998

Attest:

BRUCE LEHMAN

Attesting Officer

Commissioner of Patents and Trademarks